United States Patent [19]

Campbell et al.

[11] Patent Number: 4,885,070

[45] Date of Patent: Dec. 5, 1989

[54] METHOD AND APPARATUS FOR THE APPLICATION OF MATERIALS

[75] Inventors: Gregor A. Campbell, Glendale; Robert W. Conn, Los Angeles; Dan M. Goebel, Santa Monica, all of Calif.; Rolf Adam; Hans Aichert, both of Hanau, Fed. Rep. of Germany; Hans Betz, Bruchkoebel, Fed. Rep. of Germany; Anton Dietrich, Wiesenfeld, Fed. Rep. of Germany; Gonde Dittmer, Burscheid, Fed. Rep. of Germany; Klaus Hartig, Ronneburg, Fed. Rep. of Germany; Friedrich Hass, Rodenbach, Fed. Rep. of Germany; Rainer Ludwig, Karlstein-Bettingen; Max Mayr, Alzenau-Wasserlos, Fed. Rep. of Germany; Alfred Thelen, Wehrheim, Fed. Rep. of Germany

[73] Assignee: Leybold Aktiengesellschaft, Cologne, Fed. Rep. of Germany

[21] Appl. No.: 197,040

[22] Filed: May 20, 1988

Related U.S. Application Data

[63] Continuation-in-part of Ser. No. 155,206, Feb. 12, 1988, abandoned.

[51] Int. Cl.⁴ ............................................. C23C 14/46
[52] U.S. Cl. ........................... 204/192.11; 204/192.12; 204/298
[58] Field of Search ....................... 204/192.11, 192.12, 204/192.31, 298 BD, 298 WH, 298 PI; 118/723

[56] References Cited

U.S. PATENT DOCUMENTS

| | | | |
|---|---|---|---|
| 2,043,966 | 6/1936 | Whiston et al. | 204/298 |
| 2,146,025 | 2/1939 | Penning | 204/192.12 |
| 3,331,961 | 7/1967 | Le boutet et al. | 250/288 |
| 3,409,529 | 11/1968 | Chopra et al. | 204/192.11 |
| 3,472,751 | 10/1969 | King | 204/192.11 |
| 3,576,729 | 4/1971 | Sigournay et al. | 204/192.11 |
| 3,895,602 | 7/1975 | Bobenrieth | 118/726 |
| 3,916,034 | 10/1975 | Tsuchimoto | 427/38 |
| 4,033,843 | 7/1977 | Krikorian et al. | 204/192.26 |
| 4,046,666 | 9/1977 | McClanahan et al. | 204/298 |
| 4,080,281 | 3/1978 | Endo | 204/298 |
| 4,090,941 | 5/1978 | Wright et al. | 204/298 |
| 4,108,751 | 8/1978 | King | 204/192.11 |
| 4,128,466 | 12/1978 | Harding et al. | 204/192.28 |
| 4,166,018 | 8/1979 | Chapin | 204/192.12 |
| 4,250,009 | 2/1981 | Cuomo et al. | 204/192.11 |
| 4,416,755 | 11/1983 | Caesar et al. | 204/192.11 |
| 4,420,386 | 12/1983 | White | 204/192.31 |
| 4,471,003 | 9/1984 | Cann | 427/34 |
| 4,487,162 | 12/1984 | Cann | 118/723 |
| 4,492,620 | 1/1985 | Matsuo et al. | 204/192 |
| 4,588,490 | 5/1986 | Cuomo et al. | 204/298 |
| 4,607,193 | 8/1986 | Curren et al. | 315/5.38 |
| 4,626,399 | 12/1986 | Cohen et al. | 376/136 |
| 4,639,301 | 1/1987 | Doherty et al. | 204/192.31 |
| 4,645,342 | 2/1987 | Tanimoto et al. | 356/318 |
| 4,662,977 | 5/1987 | Motley et al. | 156/345 |
| 4,682,564 | 7/1987 | Cann | 118/620 |

FOREIGN PATENT DOCUMENTS

| | | | |
|---|---|---|---|
| 378971 | 9/1981 | Austria | 204/298 |
| 1515295 | 8/1965 | Fed. Rep. of Germany | 204/298 |
| 2610444 | 10/1976 | Fed. Rep. of Germany | 204/298 |
| 7405203 | 2/1974 | France | 204/192.11 |
| 7726681 | 9/1977 | France | 204/298 |
| 1133936 | 11/1968 | United Kingdom | 204/298 |
| 1544612 | 4/1979 | United Kingdom | 204/298 |
| 2101638 | 1/1983 | United Kingdom | 204/298 |
| 2180262A | 3/1987 | United Kingdom | 204/192.11 |

OTHER PUBLICATIONS

Loschialpo & Kapetanakos, "High Current Density... Hexaboride Cathodes" *Journal of Applied Physics*, 63(8), Apr. 15, 1988.

(List continued on next page.)

*Primary Examiner*—Aaron Weisstuch
*Attorney, Agent, or Firm*—Felfe & Lynch

[57] ABSTRACT

An apparatus to apply materials to a substrate disposed in a vacuum chamber is disclosed. A separate generator chamber containing an electron emitter is connected to the vacuum chamber by a process chamber so that a plasma of controllable cross-sectional shape and large area is formed and guided by magnets toward a target system. Positive ions may be accelerated against the target by applying an adjustable negative voltage.

46 Claims, 11 Drawing Sheets

OTHER PUBLICATIONS

Porkolab et al., *Nuclear Fusion*, vol. 21, No. 12 (1981) Electron Cyclotron Resonance Heating of Plasmas in Tandem Mirrors.

Mioduszewski, P. *J. Nuclear Materials*, 111 & 112 (1982) 253–267, Experimental Studies on Pump Limiters.

Conn, R. W., *Proc. IX IVC-V ICCS*, Madrid (1983) Tokamak Advanced Pump Limiter Experiments and Analysis.

Goebel et al., *J. Nuclear Materials*, 121 (1984) 277–282, Plasma Surface Interaction Experimental Facility (Pisces) for Materials and Edge Physics Studies.

Goebel et al., *J. Nuclear Materials*, 128 & 129 (1984) 249–252, Observation of Enhanced Particle Removal Rates in Pump Limiter Simulation Experiments.

Goebel et al., *Rev. Sci. Instrum.*, 56(9), Sep. 1985, Large-Area Lanthanum Hexaboride Electron Emitter.

Hirooka et al., *J. Nuclear Materials* 141–143 (1986) 193–197, Materials Erosion and Redeposition Studies at the Pisces Facility–Net Erosion Under Redeposition.

Goebel et al., *J. Nuclear Materials*, 145–147 (1987) 61–70, Erosion and Redeposition Experiments in the Pisces Facility.

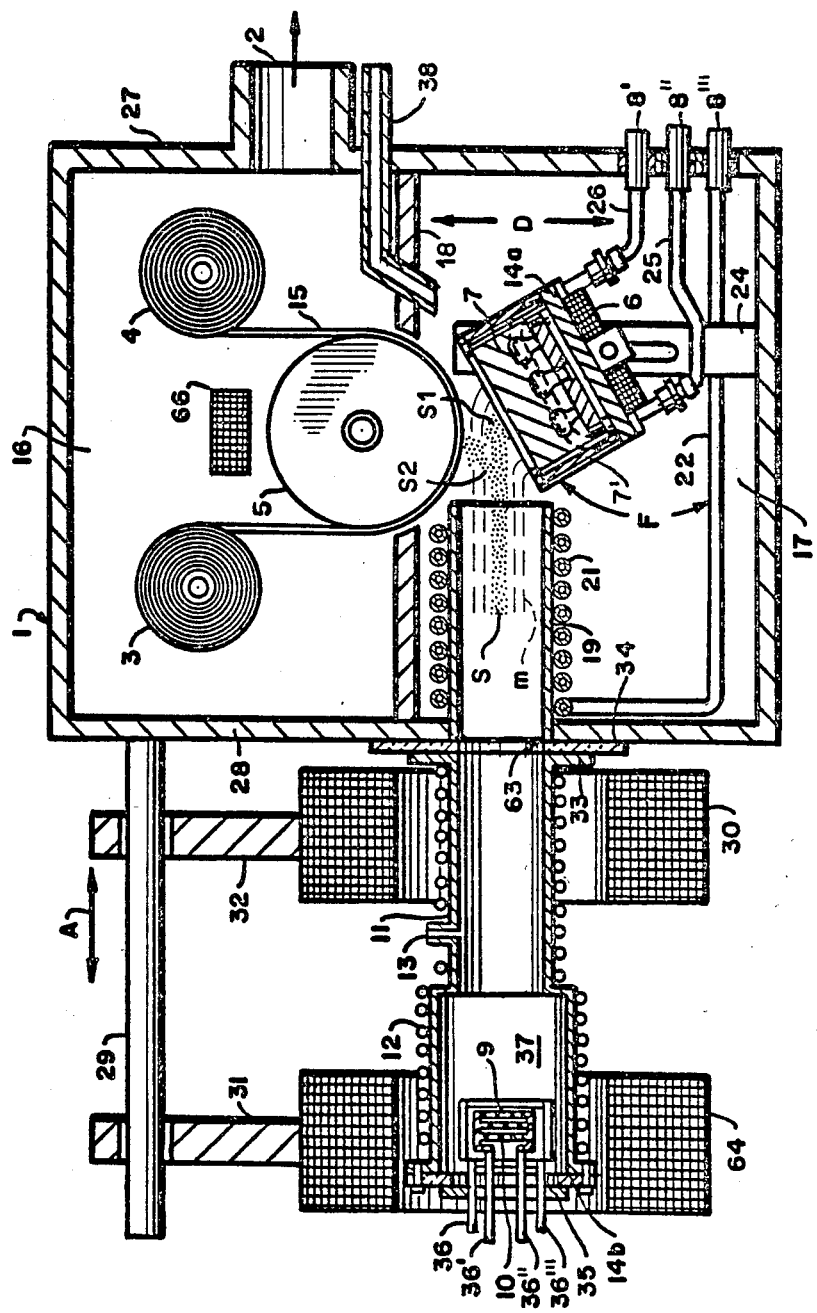

METHOD AND APPARATUS FOR THE APPLICATION OF MATERIALS

CROSS REFERENCE TO RELATED APPLICATION

This application is a continuation-in-part of copending U.S. patent application Ser. No. 155,206 filed on Feb. 12, 1988, now abandoned.

The invention relates to an apparatus for the application of materials, for example by sputtering or vapor deposition, to a substrate disposed in a vacuum chamber and having an electron emitter which is located with an anode in a separate generator chamber. The generator chamber and the vacuum chamber are connected and a process gas introduced into the generator chamber produces a large-area plasma which is guided by the action of magnets between the plasma generator and a target system. Ions in the plasma are accelerated against the target by the application of an adjustable voltage thereby sputtering or vaporizing the target for coating the substrate.

BACKGROUND

A method is known (EU-PA No. 00 20 456) for the production of transparent heat mirrors by depositing a film of mixed indium oxide or mixed tin oxide on a substrate, in which a low-temperature deposition on a polymer substrate by sputtering, thermal evaporation, vacuum depositing or electron bombardment is employed, and an oxygen partial pressure is used during the deposit which directly produces films of the above-named material with a high transparency and a high reflectivity.

In the apparatus used for the practice of this method, a water-cooled target is disposed at an angle of about 45° with respect to the ion beam produced by a radiation source in the vacuum chamber provided with a gas inlet, the ejected target source material producing a coating on the substrate which is at an angle to the target and coated with a polymer.

A plasma generator with an ion beam producer is disclosed by Goebel, Campbell, and Conn, *Journal of Nuclear Materials,* 121:277-282 (1984), North Holland Physics Publishing Division, Amsterdam; Hirooka et al., *Journal of Nuclear Materials,* 141-143:193-197 (1986) North-Holland Phys. Publishing Div., Amsterdam; and Goebel et. al, *Journal of Nuclear Materials,* 145-147:61-70 (1987) North-Holland, Amsterdam.

The Goebel et al plasma generator is disposed in a separate chamber connected to the vacuum chamber, while the approximately cylindrical wall of the separate chamber forms the anode and is provided with an inlet connection for the process gas. An accelerator is situated on a part of the wall that closes the one end of the cylindrical chamber and faces away from the actual vacuum chamber Bias is supplied to the sample or target in the generator to induce sample erosion in order to study the effects of the plasma on different materials.

The Goebel et al generator produces a small cylindrical plasma, and cannot achieve high sputtering rates because the voltage that can be applied to the target is limited. The maximum voltage that can be applied to the target surface is only 300 volts and current densities of only up to 1 amp per square centimeter were achieved.

The present invention provides apparatus for high-rate sputtering and/or evaporation of metallic or dielectric materials by means of an externally produced plasma of large area and varied cross-sectional shape. The power applied to the target is significantly greater than in prior art devices such as magnetrons and diodes. The construction of the apparatus is simple and the plasma is produced independently of the target. Target voltage and the target current can be adjusted independently of one another, in this apparatus in contrast to prior art systems.

In contrast to this, prior art magnetron devices required operating pressures in the 3-10 millitorr range and, at these pressures, the mean-free path of a sputtered atom is only a centimeter at best. Because of this short path length, sputtered material is scattered before it reaches the substrate. Typically, energies of 400-600 eV are needed to achieve useful magnetron sputtering rates, but at these energy levels substrates and targets are significantly damaged and various chemical reactions at the target surface are inhibited. See U.S. Pat. No. 4,588,490 owned by IBM. Magnetron systems are also material specific which means that the yield of secondary electrons from a target surface determines the properties of the plasma. Furthermore, the effect of magnetic drift (ExB) on sputtering wherein electrical lines of force (E) cross magnetic lines of force (B) is a well known phenomenon, as explained by Penning (U.S. Pat. No. 2,146,025) and Chapin (U.S. Pat. No. 4,166,018).

In the present invention it is possible to convert coating systems using conventional, magnetic field-supported cathode sputtering to cathode sputtering with an externally produced plasma. Also, the useful target thickness is as great as possible and its ablation is as uniform as possible.

SUMMARY

The present invention provides coating apparatus for sputter coating or vapor deposition, preferably for sputter coating, which includes: a vacuum chamber connected to a plasma beam generator, a target in the vacuum chamber including magnetic means to direct and shape the plasma beam to the surface of the target, means to accelerate ions in the plasma beam striking the surface of the target to form sputtered particles, a substrate holder positioned in the chamber for presenting a substrate to be coated with sputtered particles, and means for diverting a portion of the plasma beam to the substrate. The target can be in or out of the path of the plasma beam.

The plasma beam generator includes an electron emitter, a tubular anode downstream of the emitter having a gas inlet for admitting a process gas to ignite the plasma beam, a process chamber communicating with the anode and the vacuum chamber, and magnetic means for shaping and guiding the plasma beam through the anode and the process chamber.

In one embodiment, the target in the vacuum chamber is in the path of and normal to the plasma beam and a cage-like substrate holder is located in front of the target surrounding the plasma beam for presenting a substrate to be coated with sputtered particles.

An embodiment of the present invention adapted for vapor deposition includes a receptacle in the vacuum chamber for receiving material to be vaporized, magnetic means to direct and shape the plasma beam to the material to be vaporized and means to accelerate ions in the plasma beam to the material to be vaporized to vaporize same.

The invention also provides a coating method which includes the steps of providing a vacuum chamber and a plasma beam generator which communicates with the interior of the vacuum chamber, providing a target and a substrate holder in the vacuum chamber, said holder presenting a substrate to be coated with sputtered particles, magnetically directing and shaping the plasma beam to the surface of the target, accelerating ions in the plasma beam striking the surface of the target to form sputtered particles and diverting a portion of the plasma beam to the substrate. The target can be in or out of the path of the plasma beam.

DESCRIPTION OF THE DRAWINGS

The invention is illustrated as follows:

FIG. 2 illustrates a second embodiment of the invention according to FIG. 1 showing the position of the magnet on the side of the target system facing away from the generator system.

DESCRIPTION

Figure 1:
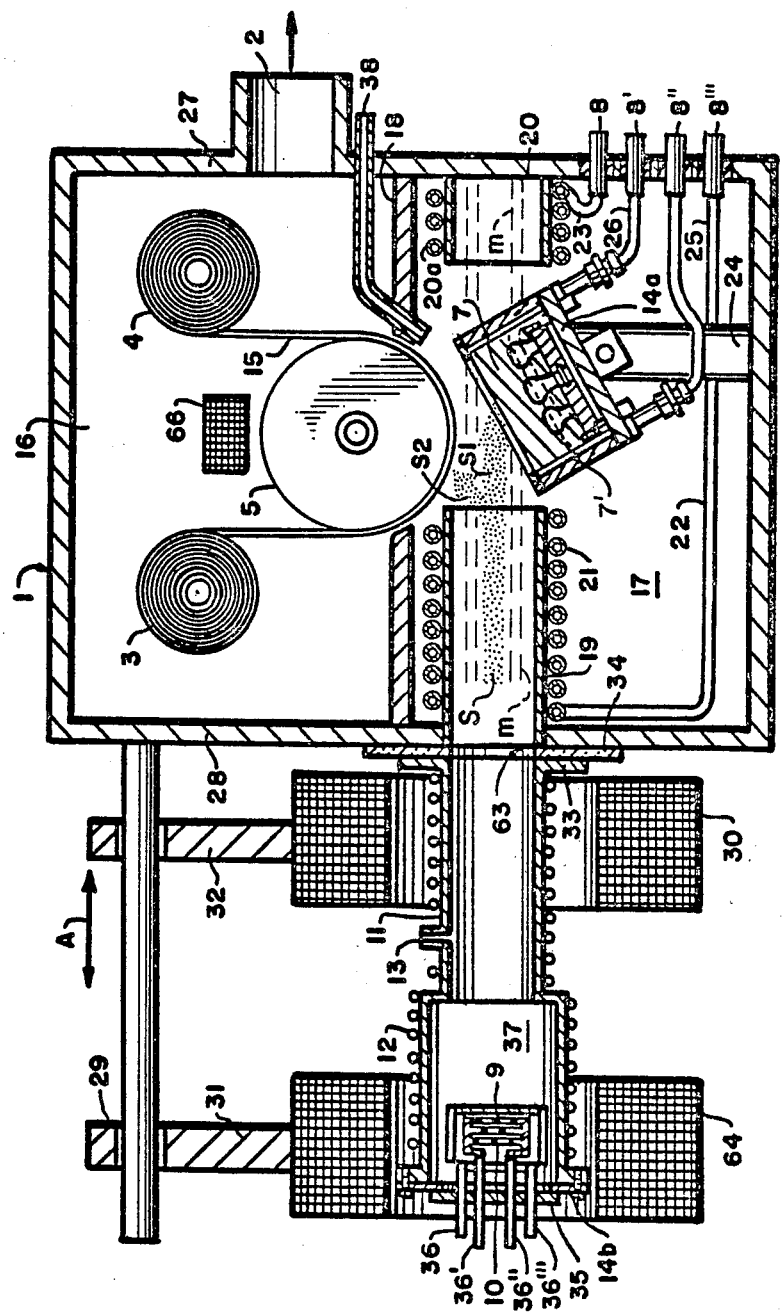
FIG. 1 is a longitudinal cross-sectional view diagrammatically illustrating the inventive apparatus with a separate plasma source for coating strips and films.

The coating apparatus according to FIG. 1 has a vacuum vessel 1 with a pumping opening 2, a supply reel 3 and a takeup reel 4 and a coating cylinder 5 journaled in the vacuum vessel 1. A dividing wall 18 separates the vacuum vessel 1 into two chambers 16 and 17 and a tube 19 extends transversely in the vacuum vessel 1 parallel to the dividing wall 18, with a magnet coil 21 wound about it having a tube 22 which forms a cooling coil. A target 7 is held on a standard 24 at an angle to the dividing wall 18 and the tube 19 and is selectably displaceable in all directions. An insulator 14a and two tubes 25 and 26 carry electrical current and cooling water, which, like tube 22 extend through the one end wall 27 of the vacuum vessel 1 at 8′, 8″, and 8‴.

In a preferred embodiment as illustrated in FIG. 1 tube 20 is provided on an opposing wall of the vacuum vessel 1 from tube 19. Tube 20 extends transversely in the vessel 1 parallel to the dividing wall 18 and has a magnet 20a wound around it and having a cooling coil 23. The cooling coil 23 extends through the end wall 27 at position 8 and is sealed in position.

Further, an inlet connection 38 may be provided which extends through the end wall 27 to a point between the substrate 15 and target 7 as illustrated in FIG. 1. The inlet connection 38 is used if reactive cathode sputtering in the vicinity of the substrate is desired and reactive gas will be admitted into the chamber 17 through the inlet connection 38, thus achieving physical conditions comparable to those of conventional reactive cathode sputtering.

The coating apparatus furthermore has a rail 29 fixedly disposed on the other end wall 28 of vacuum vessel 1. On this rail 29 the magnet coils 64 and 30 are movably carried with their coil hangers 31 and 32 in the direction of the arrow A. An anode 11 preferably of a tubular configuration is concentrically disposed relative to the magnet coils 64 and 30 and is provided with a longitudinal axis which is aligned with the longitudinal axis of the tube 19 in chamber 17 of the vacuum vessel 1 and whose remote end from the vacuum vessel 1 is closed with an insulator 14b which bears an electron emitter 9 and the heater 10.

The anode 11 has at its end adjacent to the vacuum vessel 1 a flange 33 by which it is held on the end wall 28 of the vacuum vessel 1, but between the flange 33 and the end wall 28 an insulator 34 is disposed which insulates the tubular anode 11 electrically from the tube 19 and from the end wall 28. The anode 11 in the form of a hollow member having an approximately rectangular, oval or circular cross section has an inlet connection 13 laterally disposed and projecting radially outwardly, and is surrounded by a coil of tubing 12 through which cooling water flows. The insulator 14b is affixed to a perforated plate 35 on which the water and electrical power lead-throughs 36, 36′, 36″ and 36‴ are provided.

As shown in FIG. 1, the magnet coils 20a and 21 on the two tubes 19 and 20 are disposed in chamber 17 such that they are in line with the tubular generator chamber, the one tube 19 being in the form of a prolongation of the tubular anode 11, while the other tube 20 is fastened to the end of the vacuum vessel 1 that is opposite the anode 11, the target 7 which is surrounded by a dark space shield 7′ being situated in the free space between the two tubes 19 and 20. The magnets 20a and 21 consist of tubular coil windings, tubes 22 and 23 carrying cooling water and serving simultaneously as conductors of electrical current and being insulated from one another. The additional magnet 66 can be disposed either above the coating cylinder 5 between the substrate 15 and vacuum chamber wall, as represented in FIG. 1, or inside of the coating cylinder, or laterally.

The magnet coils 21 and 20a surrounding the tubes 19 and 20, respectively cooperate to maintain the magnetic lines of force M in a generally parallel direction relative to the plasma beam S to divert one part S1 of the beam to the face of the target 7 to strike it. A second path S2 of the beam S is directed toward the substrate under he influence of magnets 66 and 20a as illustrated in FIG. 1.

In the interior of the tubularly constructed, evacuated generator chamber 37 primary electrons are emitted from electron emitters (which are preferably formed of lanthanum hexaboride) and are accelerated away from the emitter by the negative voltage applied to the emitter. The magnetic field produced by magnet coils 30 and 64 inhibits electrons from reaching the anode 11. By means of gas simultaneously admitted into the generator chamber 37 through the inlet connection 13 a plasma is created by electron impact ionization of the gas, producing positively charged ions and cold plasma electrons. The plasma electrons are electrostatically confined by a negative bias at the target and also at the emitter. The negative bias at the target can be an applied bias provided by a power supply or can be a self bias that develops due to the plasma making contact with the target.

The magnetic field causes the emitted primary electrons to drift along the lines of force M and to reach the anode 11 only as a result of collisions, while secondary electrons struck from the target 7, which also contribute to the ionization, are captured. The ions thus produced likewise drift along the magnetic lines of force M toward the target 7. Thus an ion stream of high intensity is available at the target, up to magnitudes of the order of one ampere per square centimeter. The energy of the ions is, however, low.

In FIG. 2, a preferred embodiment of the target system 7 is illustrated with a magnet 6 disposed on the side of the target 7 facing away from the substrate. The magnet coils 6, 30, 21, and 64, which surround both the generator chamber 37 and the target 7, are illustrated in FIG. 2 and restrict the plasma to a tubular zone between the electron emitter 9 of generator chamber 37 and the target 7.

Figure 2A:
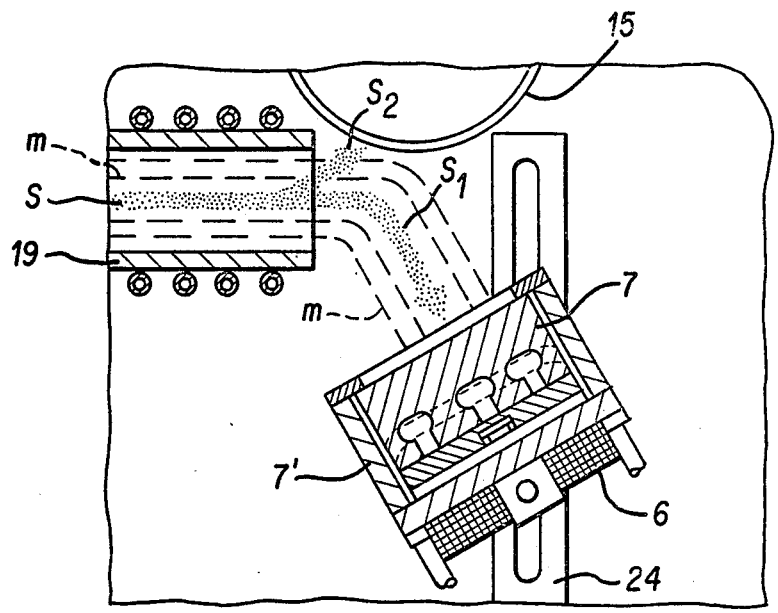
FIG. 2A is an enlarged cross sectional view illustrating the target of FIG. 2 positioned at an angle relative to the process tube.

FIG. 2A illustrates the target as rotatable on the standard 24 with the face of the target 7 positioned at an acute angle relative to the substrate 15 and process tube 19, out of the path of the plasma beam and at an angle not greater than 90° to the plasma beam. In this position the magnet 6 and the magnetic coil 21 direct the magnetic lines M toward the face of the target 7 to divert the beams into two paths, path S1 striking the target face and path S2 striking the substrate.

Figure 2B:
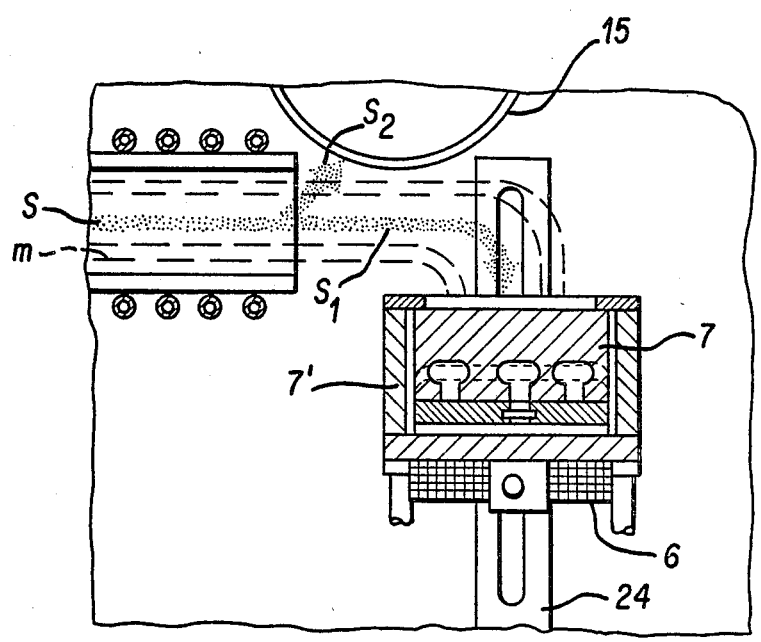
FIG. 2B is an enlarged cross sectional view illustrating the target of FIG. 2 in a parallel position relative to the substrate.

FIG. 2B illustrates the target 7 in a parallel position relative to the substrate 15 and process tube 19, out of the path of the plasma beam S and at a 90° angle to the plasma beam. The repositioning of the magnet 6 relative to the magnetic coil 21, and magnet 6 effect the diversion of the beam paths S1 and S2. It may be appreciated that the target may be positioned at any angle relative to the process tube 19.

In a preferred embodiment, the target 7 may be replaced with a receptacle for holding a vaporizable material which would be vaporized by the plasma beam S1. Also, adjustable bias voltage may be applied to the substrate.

Splitting of the plasma S into two paths S1 and S2 has many beneficial uses: (1) the beam path S2 pretreats the substrate 15 to prepare the substrate to receive the sputter coating by cleaning and activating the surface of the substrate; (2) a reactive gas, such as oxygen, nitrogen, ammonia, acetylene or any suitable gas, fed into the area of the target 7 via the gas inlet tube 38 is activated by the split beam. This is known as chemical vapor deposition (CVD); (3) ion assisted deposition occurs because the diverted beam S2 strikes the substrate 15 with the assistance of the magnet 66 which is associated with the substrate cylinder 5. Ions in the beam path S2 simultaneously strike the substrate as it is being coated thereby assisting in the coating process and providing for better adhesion and a better coating; and (4) sputtered particles coming off the face of the target 7 are ionized by the incoming plasma path S1 as well as the diverted path S2 such that the sputtered particles are deposited as ions which are then converted on the surface by acquiring electrons into a more stable neutral state. The result is better adhesion of the coating to the substrate and a different type of film coating than the coating achieved with conventional sputter coating. This is a preferable effect when the target 7 is metal and metal ions are produced on the substrate 15.

By means of the magnet coils 6, 30, 21, 20a and 64 a large area plasma beam of variable current produced by a separate plasma source is guided onto the electrically biased target 7, positive ions are accelerated from the plasma S onto the target (i.e. S1) and atoms produced by a sputtering or evaporation process are deposited onto the substrate. A high frequency voltage, voltage pulses or an adjustable alternating voltage may be used to accelerate the ions.

By modifying the magnetic field M it is possible to "bend" the plasma beam by as much as 180° as well as shape its cross-section. Therefore the target 7 can be installed in virtually any desired position relative to the longitudinal axis of the generator chamber 37 and to the tube 19.

In the sputtering of a metallic target, argon gas is admitted into the generator chamber 37, an argon plasma is created, and a voltage in the 100 volts to kilovolt range is applied to the target 7. While conditions on the target surface are similar to targets used in DC magnetron cathode sputtering and the properties of the applied coatings are comparable, the following advantages of the inventive system over DC magnetron cathode sputtering are achieved.

The power that can be fed to the target 7 is significantly greater. For example, an ion current of 1 ampere per square centimeter and a target voltage of 750 V will result in a power per unit area on the target of 750 watts per square centimeter. This is to be compared with a maximum power per unit area of several tens of watts per square centimeter in DC magnetron cathode sputtering. The sputtering rate increases accordingly. For copper a rate of 1200 Angstroms per second was measured at a target substrate spacing of 100 mm with a plasma beam diameter of 100 mm.

The construction of the target 7 is simpler than a DC magnetron system. The target current and target voltage are also independently variable, whereas in DC magnetron cathode sputtering they are tied together by a characteristic curve. The possibility of independent variation of current and voltage offers the advantage of being able to control the sputtering rate via the target current and to control the properties of the sputtered coating via the target voltage, independently of one another. Target voltages as low as 25 V can be applied to the target.

An important difference between the inventive process and DC magnetron cathode sputtering is that the electrons producing the plasma are supplied by the cathode in a reactive DC magnetron cathode sputtering system and, therefore, the process is very sensitive to changes in the chemical nature of the cathode surface. In the inventive apparatus the ions are supplied from outside the vacuum vessel 1 and external to the target 7 and the system is therefore substantially more stable.

The inventive apparatus fully provides the advantages described for the metallic target sputterer. An additional advantage is to be seen in the fact that the intense plasma beam can be used to make reactive gas admitted into the vacuum vessel 1 more reactive (i.e. dissociation of reactive gas molecules, excitation and ionization of reactive gas atoms). The additional mask systems, anodes and anode current supplies necessary as a rule in a reactive gas sputtering process are unnecessary in the inventive device.

In an experiment the inventive system described was used in applying aluminum nitride coatings at a rate of about 100 Angstroms per second. This rate is higher by a factor of about three than that achieved in reactive DC magnetron sputtering.

If the magnetic field in front of the target 7 is sufficiently weak, it is possible to divide the plasma so that some of the plasma can be used for sputtering a metal target and some for activating the reactive gas or for the plasma the substrate. The plasma can be further shaped by means of a magnet 66 disposed near the back of the substrate in the vacuum chamber between the supply reel 3 and takeup reel 4 as illustrated in FIGS. 1 and 2.

At the high densities that can be achieved by the inventive device is possible, if the cooling of the target 7 is sufficiently low, to melt and evaporate a suitable target plasma beam. For this purpose, the target 7 should be horizontally, i.e., parallel to the longitudinal the tube 19.

The intense present causes the formation of coatings with better properties than those formed by known, common evaporating systems, since clusters of metal evaporated in the plasma are broken up and the vaporized metal atoms are ionized in part.

The method described simplifies the machinery since, in contrast to electron beam evaporation, no high voltage is necessary (e.g. typical source voltage 80 V, typical target voltage 50 V to 700 V).

The plasma can also be produced with a large cross-sectional area in any desired form. For example, a rectangular, oval, polygonal or circular anode 11 may be used to determine the shape of the beam and the plasma's cross-section may be changed by altering the sizes of the electron emitter 9 and the anode 11 and by using shaped magnet coils or permanent magnets surrounding the anode tube and the process chamber to alter the cross-sectional shape of the magnetic field pattern. A shutter or mask may also be used to shape the beam S. It may be appreciated that the plasma beam can be shaped to conform to the configuration or type of substrate to be coated, as well as to the shape of the target. No scanning apparatus is necessary. Furthermore, since the plasma beam is itself quasi-neutral, its manipulation is considerably simpler. Additional equipment for neutralizing the beam is unnecessary.

To coat a substrate 15 with an alloy of a specific composition it is possible to use a target 7 of that composition and to sputter the target. If, however, the composition of the coating to be applied must be changeable, it is desirable to use a variety of targets 7 consisting of the individual alloy components and to cover all of the targets with a single large-area plasma beam. By applying different electrical voltages to the individual types of target the desired composition of the coating sputtered onto the substrate 15 can be established.

Due to the compactness of the targets 7 used here, relative to the size of the cathodes of DC magnetrons, it is possible, for example, to arrange target portions of two different elements in a checkerboard pattern. This makes it possible to sputter an alloy onto a substrate 15 with very little variation of the composition over the width of the coating.

It is also possible to arrange a plurality of targets 7 concentric with the plasma beam axis or perpendicular to the magnetic lines of force. Since each target 7 is to be associated with a sputtering rate that is symmetrical with the beam axis, the result will be a composition of the different coating components sputtered that is constant over the entire coating surface of a substrate parallel to the plasma beam.

By appropriate selection of the operating parameters it is, furthermore, possible to operate the described apparatus as a metal ion source. The ionization probability of the sputtered metal atoms in the plasma beam is, among other things, a function of plasma density and electron energy. In the case of the plasma densities that are common in this case, the electron energy can be increased by lowering the neutral partial pressure to $1 \times 10^{-4}$ mbar to such an extent that copper atoms, for example, will be ionized by the plasma within a few centimeters of travel through the plasma.

If the target 7 is perpendicular to the magnetic lines of force, the result will be, on account or the different masses and energies of the different types of ions, different Larmor radii at which the individual types of ions circulate about the magnetic lines of force (e.g., Ar=approx. 4 cm, Cu=approx. 14 cm, at a magnetic field strength of 100 gauss). Thus it is possible to separate the types of metal ions.

Figure 3:
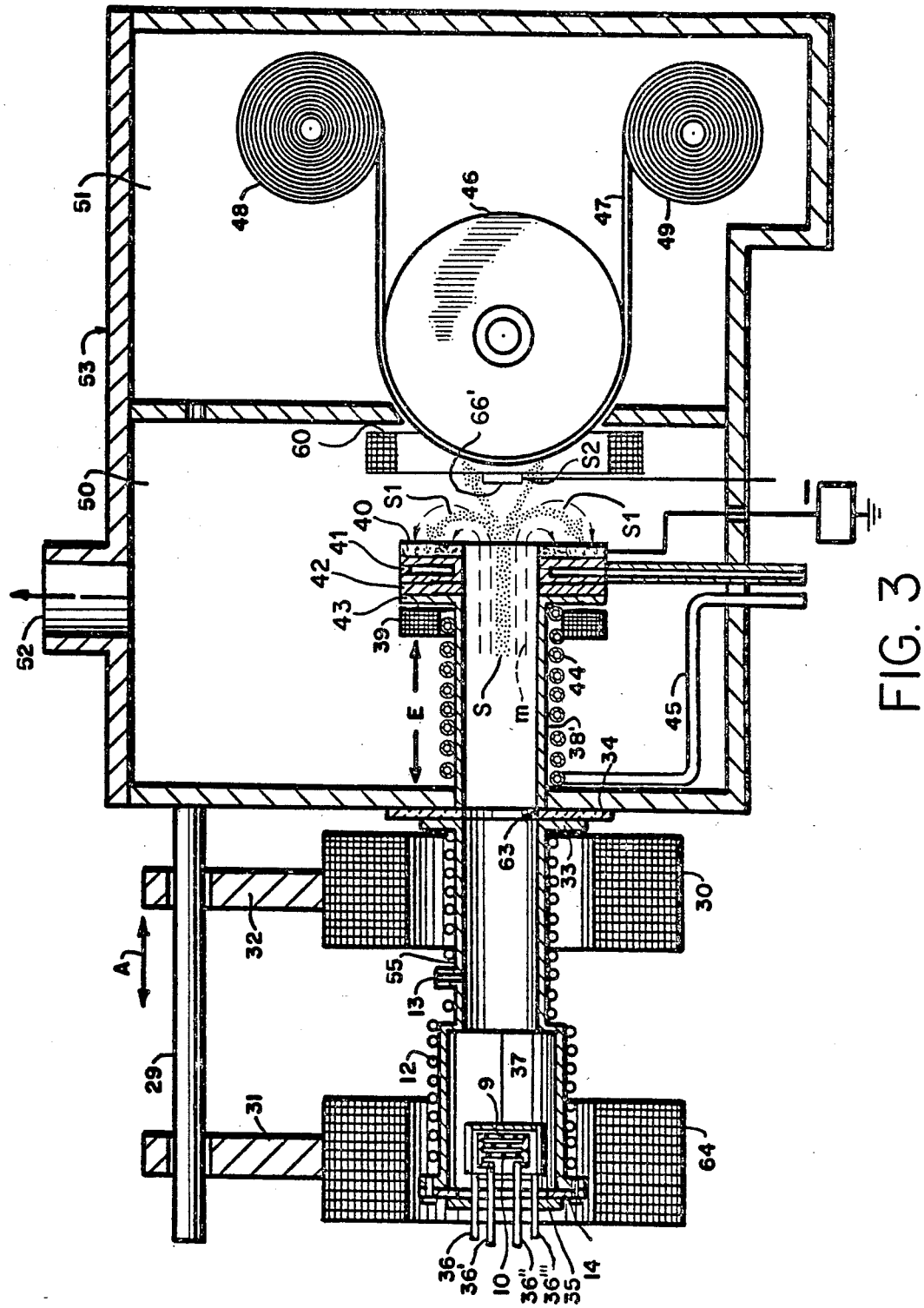
FIG. 3 illustrates a third embodiment of the invention according to FIG. 1 showing another arrangement of the target system relative to the generator chamber.

The apparatus according to FIG. 3 has an anode 55 of rectangular cross section and a similarly shaped tube 38′ surrounded by an additional frame-like electromagnet 39 which is movable in the direction of the arrow E. Furthermore, the target 40 disposed in the chamber 50 of the vacuum vessel 53 is fastened together with cooling flange 41 to a ring-like or frame-like insulator 42 which in turn is affixed to the flange 43 which is part of the tube 38′. Th tube 38′ is wound with a coil of the tubing which simultaneously acts as a magnet coil 44 and is connected to the tube 45. The tube 45 on the one hand reeds cooling water in and out and on the other hand forms the conductor for the electromagnet 44. Opposite the target 40 is the coating cylinder 46 over which the substrate or substrate film 47 runs from the feed roll 48 to the take-up roll 49.

The plasma beam S emerging from the tube 38′ during operation of the device travels substantially down the center of the process tube 38′ along magnetic lines M. The plasma beam S is shaped by the field provided by magnet 39 and magnet 60 and is then bent backwards to strike the target 40. A shield 66′ may be provided in front of the substrate 15 between the target 40 and substrate to shield the substrate from direct plasma bombardment by beam $S_2$. No erosion pit is formed on the target 40 in this device; instead, the material of the target 40 is ablated comparatively uniformly.

Figure 4:
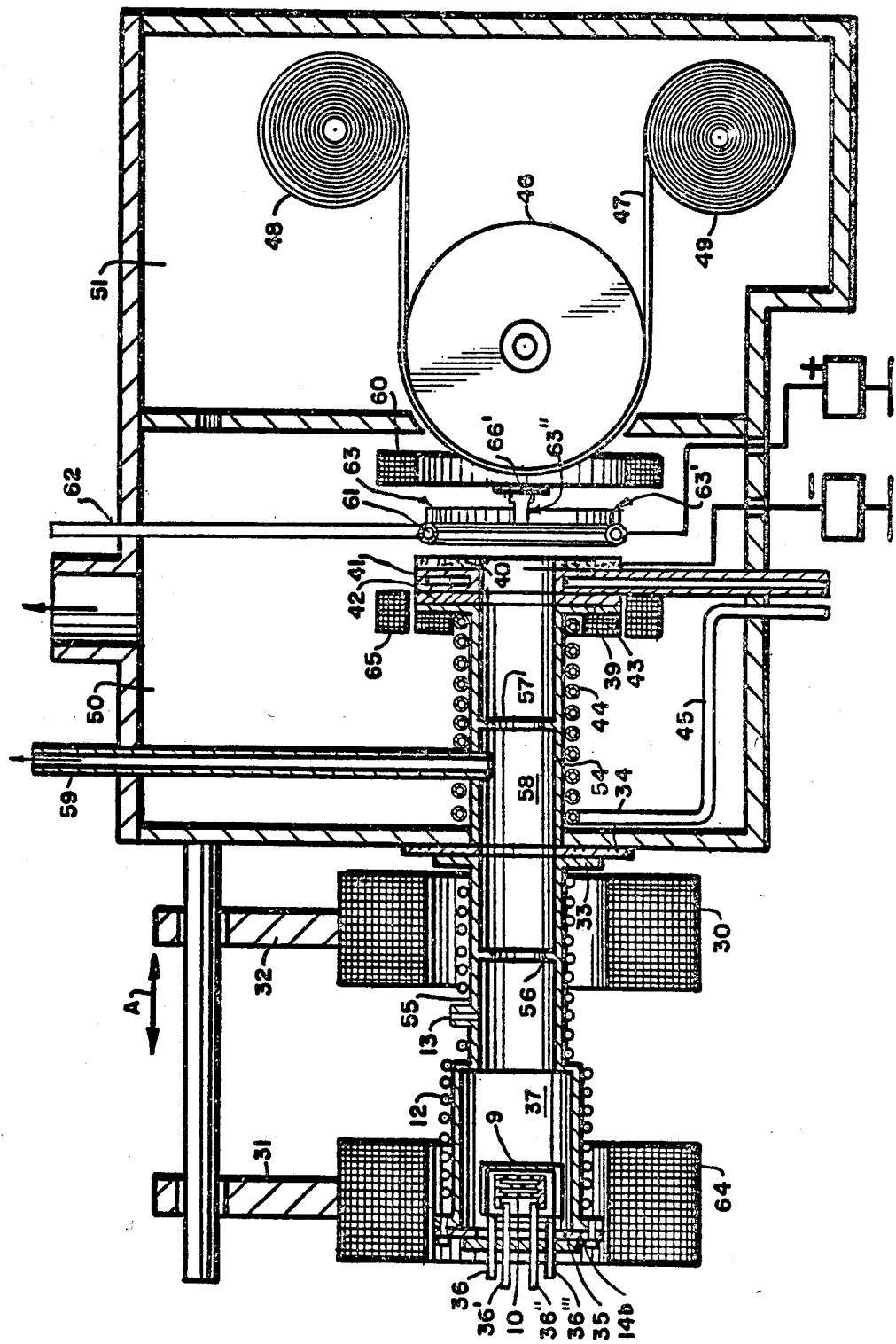
FIG. 4 diagrammatically illustrates the apparatus of FIG. 3 with an additional reactive gas inlet in the area between the target and substrate.
Figure 4A:
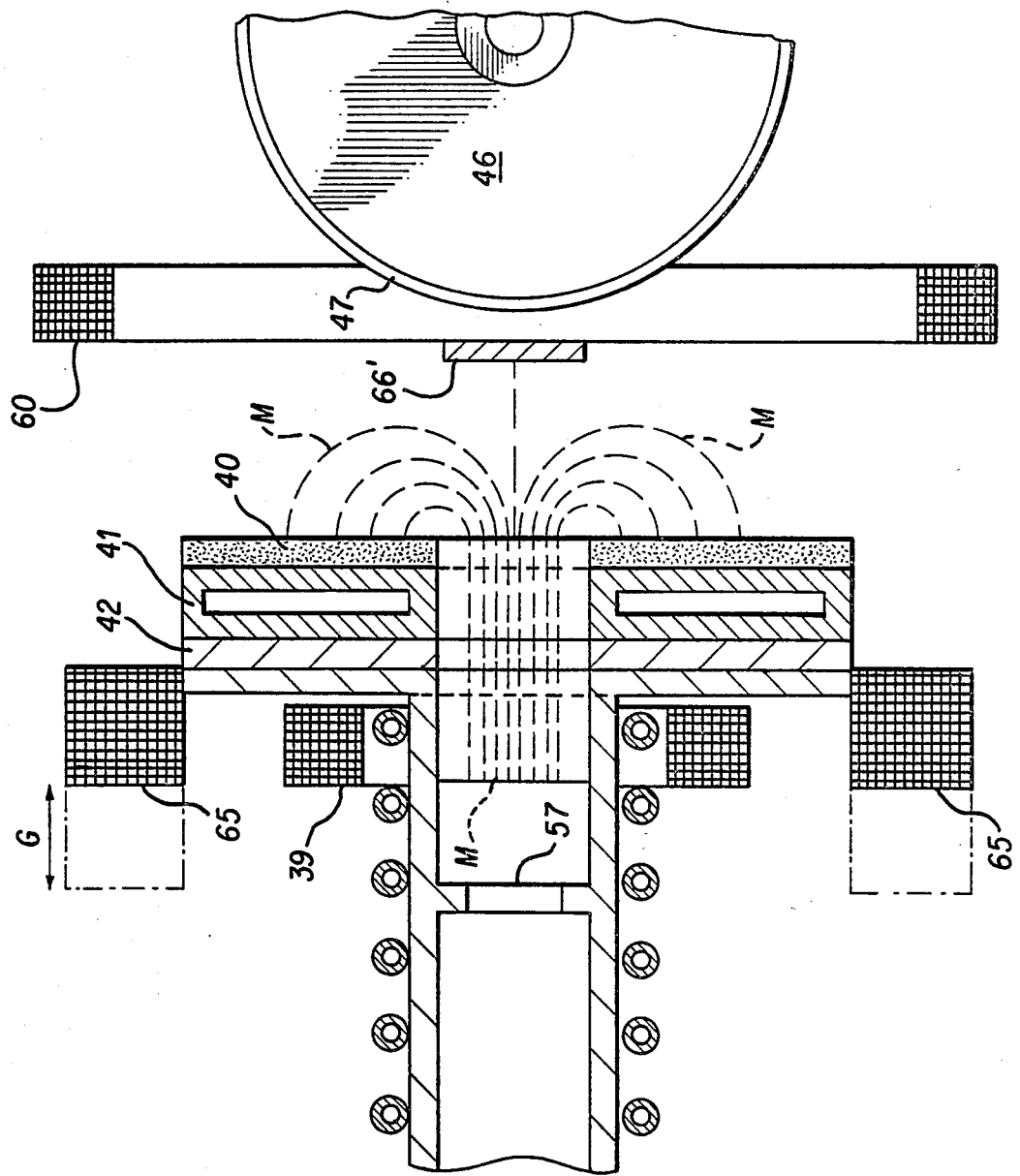
FIG. 4A is an enlarged cross sectional view of the target of FIG. 4 illustrating the direction of travel of the magnetic lines exiting from the process tube.

In the case of the apparatus in FIG. 4, the tube 54 and the anode 55 are provided with diaphragms 56, 57; the chamber 58 defined by the two diaphragms being connected to an additional exhaust tube 59. This intermediate exhaust makes it possible to reduce or entirely prevent any possible neutral particle flow from the target 40 to the source 9. Magnetic fields concentrate the plasma S into an hour-glass shape and diaphragms 56,57 are then placed around the shaped plasma S to prevent reactive low energy gas from going back into the generator to promote longer life of the device. Since there is no empty space in the plasma S, neutral gas cannot pass without reacting with the plasma S.

Between the coating cylinder 46 and the target 40 there are also disposed a magnet coil 60 and a frame-like gas inlet tube 61 connected to the tube 62 having nozzles 63, 63', and 63". Furthermore, still another movable magnet coil 65 is provided which in conjunction with the other magnet coils 44 and 60 permits the plasma beam in the area of the target 40 to be influenced. For example, magnet 39 serves to draw the magnetic lines M out of the process tube 38' and the addition of the magnet 60 whose field is in the opposite direction of magnet 39 pushes the magnetic lines M back toward the target 40. Magnet 65 in combination with magnet 60 can be used to alter the shape of the magnetic field.

Referring to FIG. 44, magnet 65 can be moved in a parallel direction relative to the process tube 38' as indicated by the arrow G and the second position of the magnet 65 shown in phantom lines. Only the magnetic lines M are illustrated but it is understood that the plasma S follows the magnetic lines M.

The gas (e.g., oxygen) emerging from the nozzles 63 and 63' reacts chemically with the atoms and the plasma before being deposited on the substrate to thus enable the atoms and the plasma to be made more reactive with the substrate. A plate 66' disposed in the are of the longitudinal axis of the tube 54 makes it possible to shield the central plasma thread. A nozzle 63", which is disposed in the area of the plate 66' causes the emerging gas to be more easily made reactive by the plasma.

Inclusion of additional gas inlets 13 to distribute process gas when a larger tube 21 is employed is optional. A plurality of inlets is preferable when a long rectangular plasma shape (i.e. ribbon-like) is desired. A plasma beam having an oval or round cross-section may be sufficiently ignited from one gas inlet.

Figure 5:
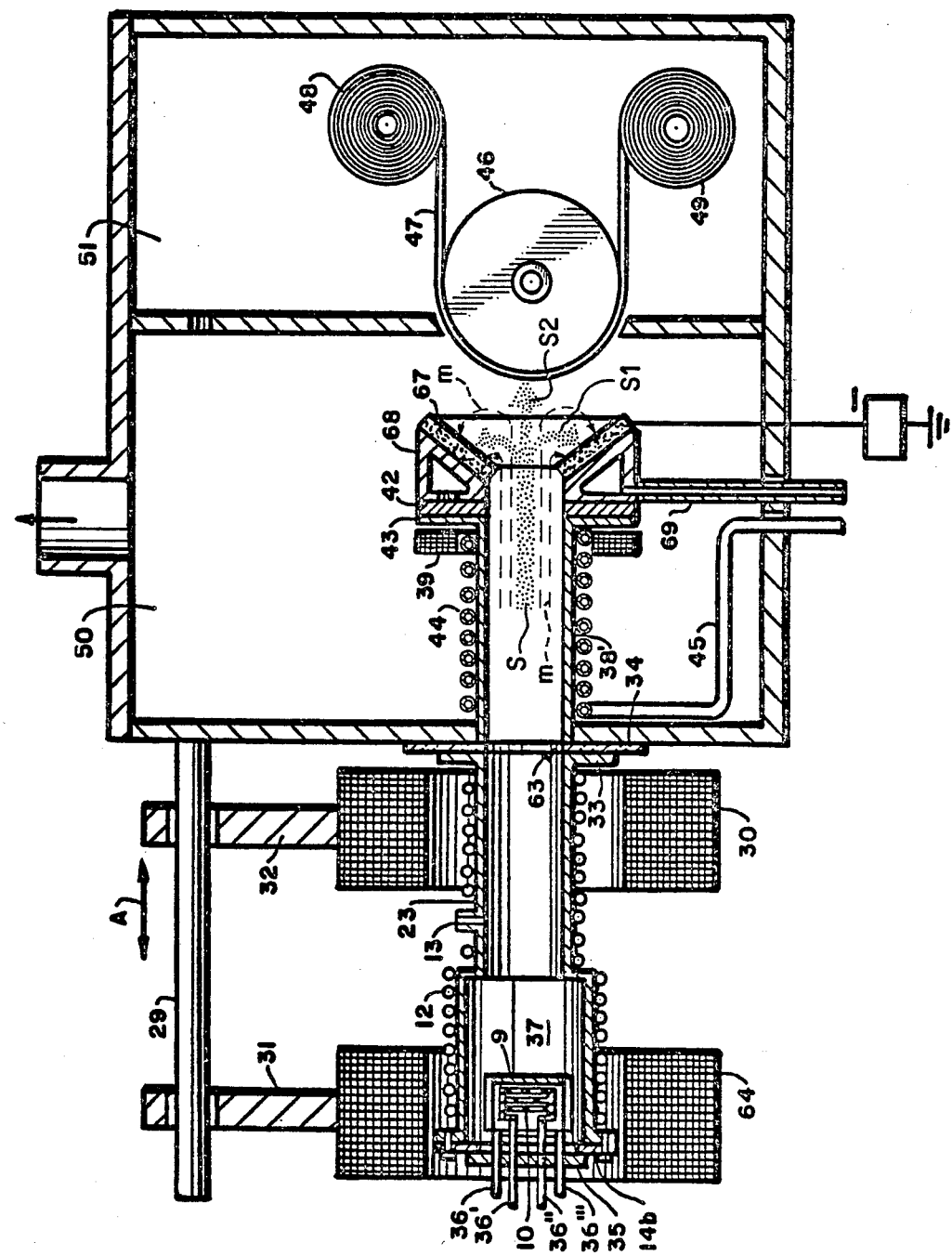
FIG. 5 diagrammatically illustrates another embodiment of the apparatus shown in FIG. 3 having a cone-shaped target.

In the embodiment according to FIG. 5, the target 67 is of a trough-like or funnel-shaped configuration. The cooling flange 68 connected to the cooling line 69 and fastened to the insulator ring 42 has a similar trough-like or funnel-like configuration. The cooling flange 68 may have an approximately circular, rectangular or trapezoidal cross section.

Because of the slanting of the surface of the target 67 with respect to the longitudinal axis of the tube 38', a component of the electrical field is utilized which runs perpendicular to the magnet field, so that a magnetron-like racetrack (i.e. electron track) forms on the target 67.

In FIGS. 3 and 4 as compared to FIG. 5, the ExB magnetic field effect is not present since the magnetic lines of force B are nearly parallel to the electric field. In FIG. 5, the ExB effect is utilized by slanting the target 67.

Figure 6:
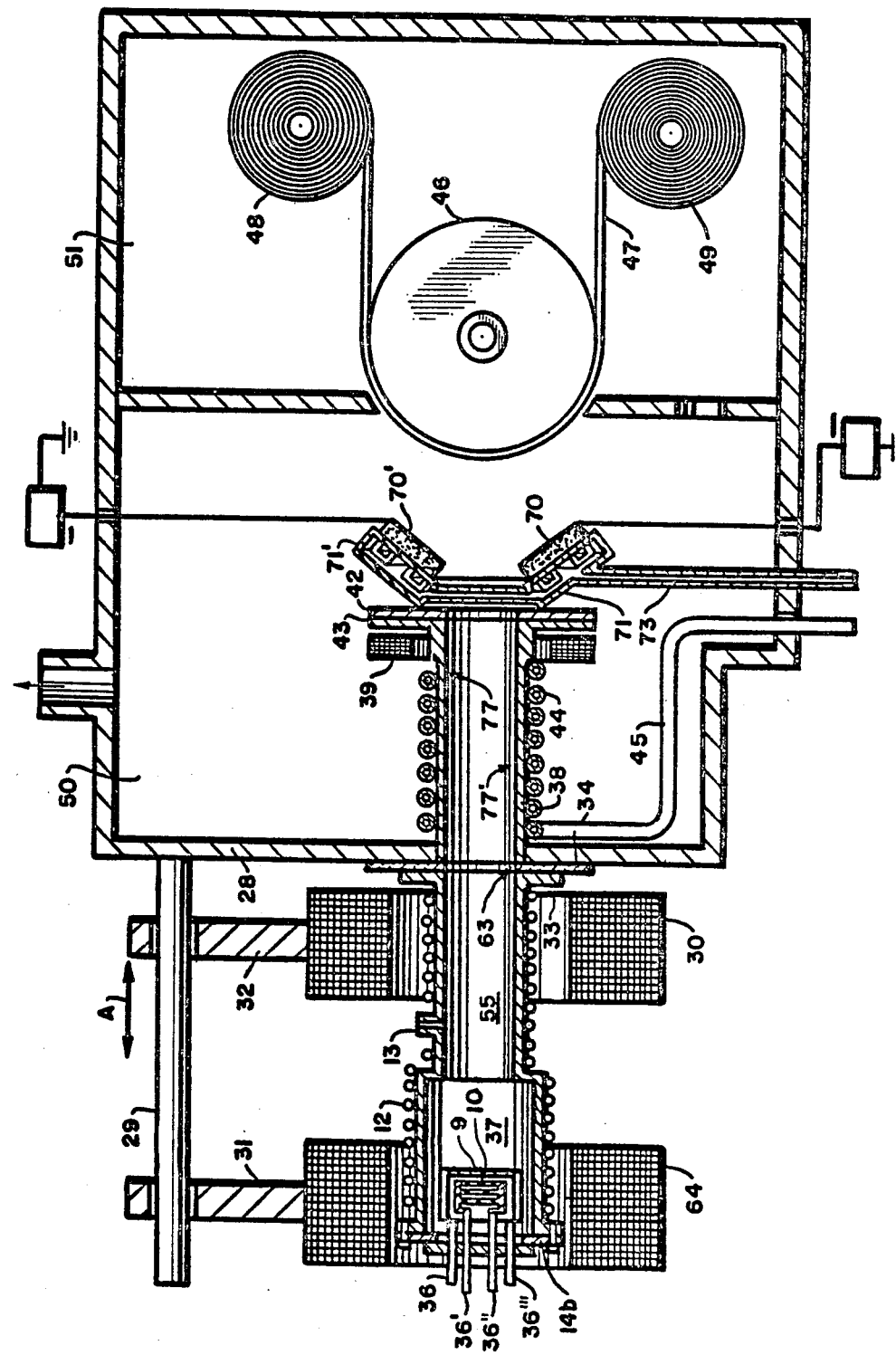
FIG. 6 diagrammatically illustrates another embodiment of the inventive apparatus according to FIG. 3 and having additional permanent magnets in the area of two targets disposed at an angle to one another.

In the embodiment according to FIG. 6, two flat or oblong targets 70, 70', are fastened to cooling flanges 71, 71', which are connected to coolant line 73 and which have in their interior permanent magnets 72, 72', 72", 72''' and 74, 74', 74", 74''', respectively (see FIG. 8), whose magnetic fields can produce several racetracks 75, 76, 75', 76'. The two targets 70, 70', form with the longitudinal axis of the tube of rectangular profile the angles α and α' of about 45° each.

Figure 7:
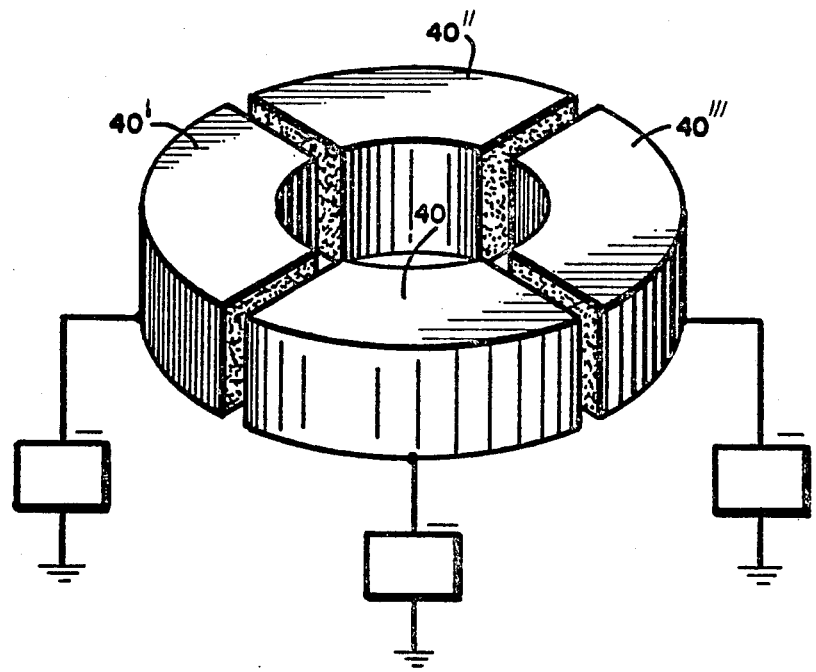
FIG. 7 is a perspective view of a multipartite target.

As shown in FIG. 7, the target 40 according to FIGS. 3 and 4 can also be composed of a plurality of sector-shaped parts 40', 40", 40'''. It may be appreciated that the individual parts 40', 40", 40'''can be made of different materials which are suitable and known in the art.

Figure 8:
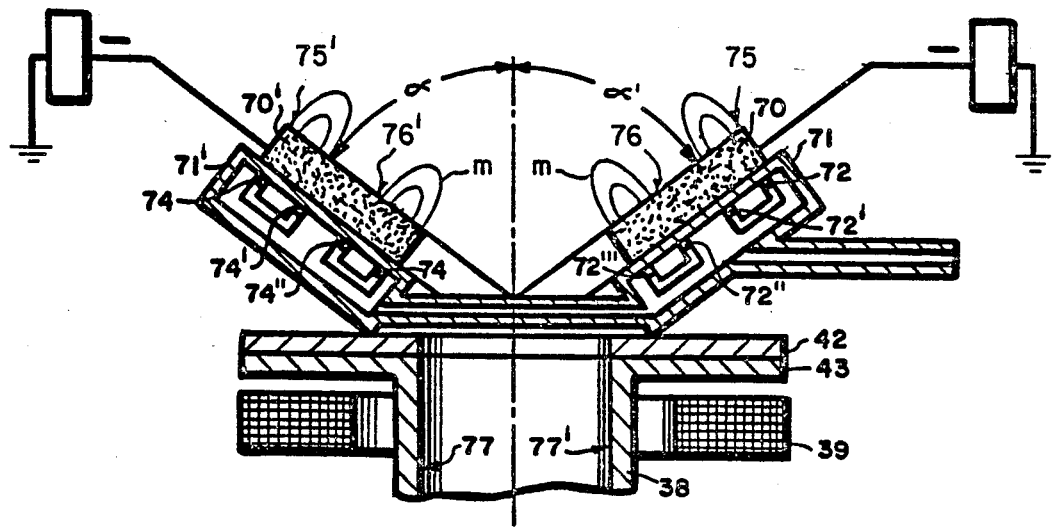
FIG. 8 is an enlarged longitudinal cross-sectional view of the target illustrated in FIG. 6.
Figure 9:
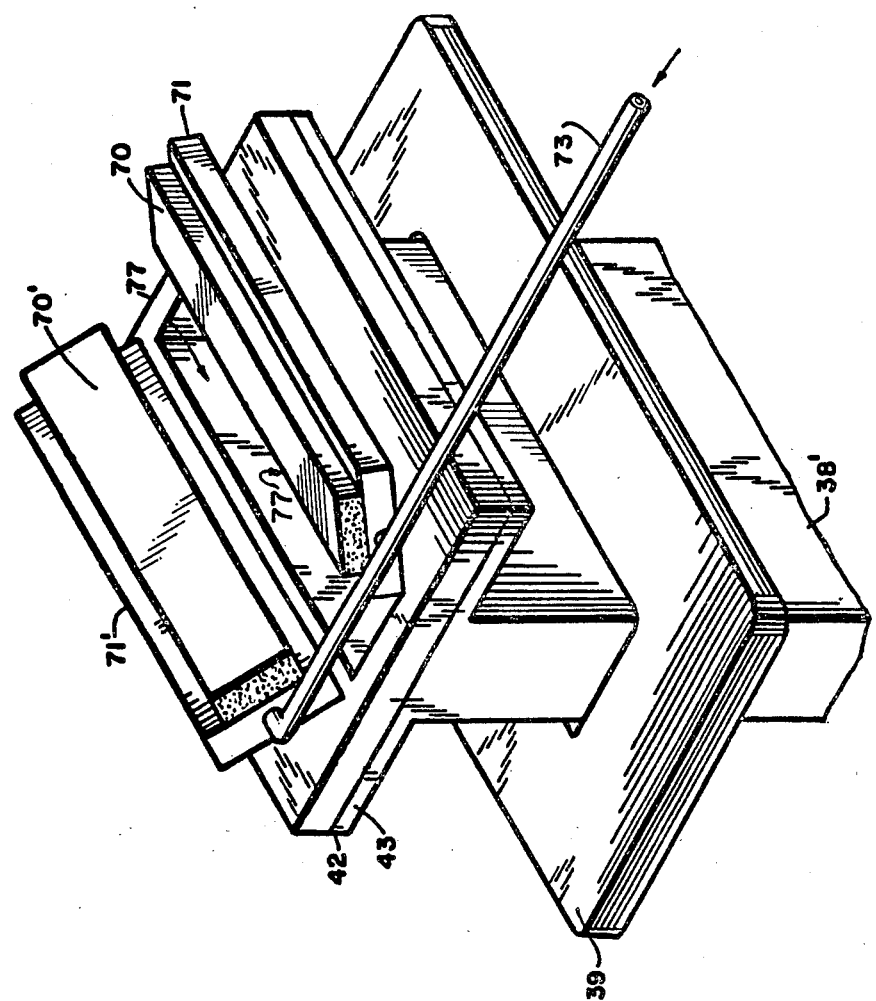
FIG. 9 is a perspective view of the targets illustrated in FIGS. 6 and 8.

The targets 70, 70', represented in different views in FIGS. 8 and 9 permit a completely uniform coating of a band of comparatively great width, FIG. 9 showing that the tube 38' has a rectangular shape and that the two planar target surfaces are disposed at an angle to the confronting inner walls 77, 77', of the tube 38'.

Figure 10:
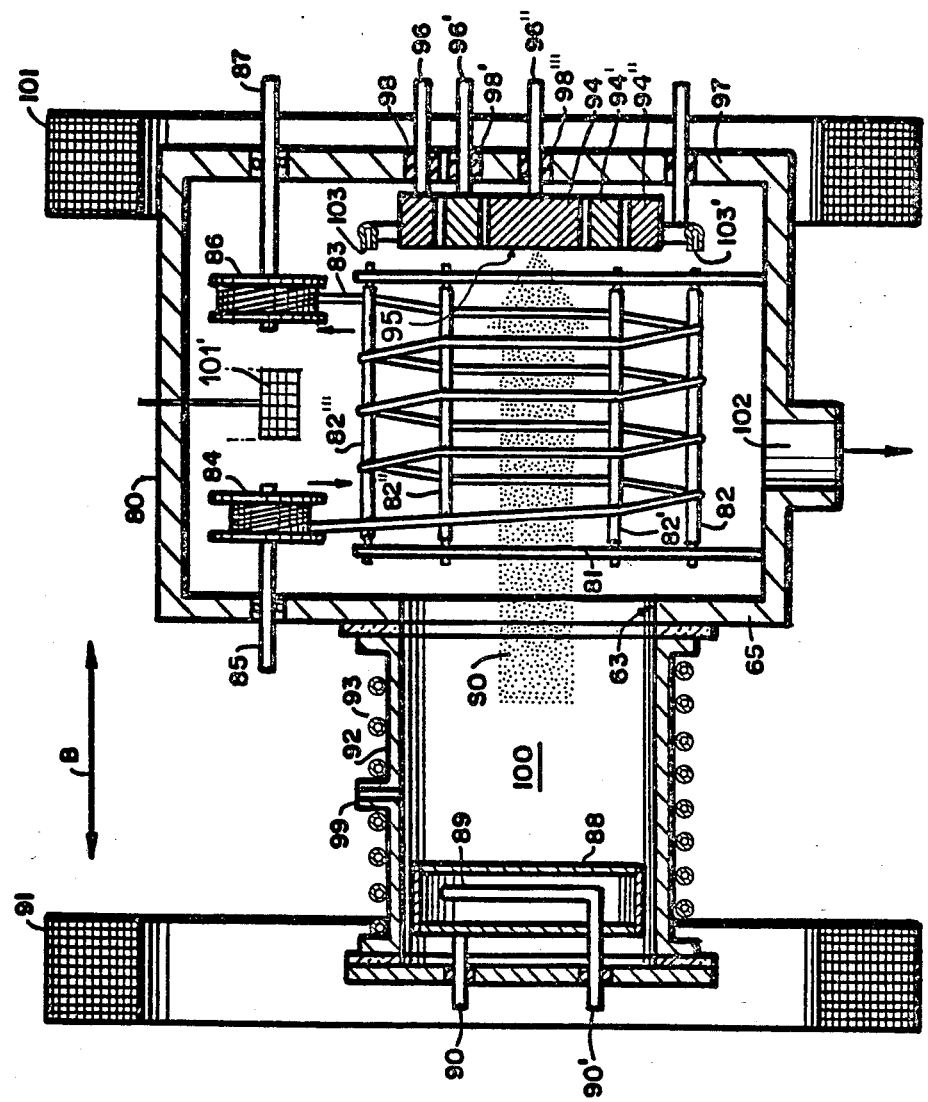
FIG. 10 illustrates an embodiment of the invention according to FIG. 1 where the target system is arranged to coat wire.

FIG. 10 illustrates a preferred embodiment of the apparatus used for coating wire. In contrast to the invention illustrated in FIG. 1, the embodiment has a cage-like frame 81 disposed in the vacuum vessel 80, rather than a strip-like substrate carried over spools. The cage-like frame 81 is provided with six parallel rollers 82, 82'; 82", 82" (two rollers not shown) journaled to the frame and the substrate in the form of wire 83 is guided over the rollers 82, 82', 82", 82'''. The wire 83 runs during the coating process from a supply spool 84, journaled on a shaft 85 over rollers 82, 82', 82", 82''' to the take-up spool 86 disposed on a driven shaft 87. The electron emitter 88 with heater and the water and electric power inlets 90, 90'differs from those illustrated in FIG. 1 as only one magnet coil 91 surrounds the tubular anode 92 with its tubular coil 93. The target 94, 94', 94" is formed of a plurality of concentrically composed parts and arranged such that its discoidal end face 95 is perpendicular to the longitudinal axis of the tubular anode 92.

The target 94, 94', 94" is provided with water and power connections 96, 96', 96" which are brought through the wall 97 at points 98, 98', 98".

A tube connection 99 is provided in the anode 52 for the admission of gas into the source 100 and a magnet coil 101 surrounds the vacuum vessel 80. Both of the magnet coils 91 and 101 are movable in the direction of arrow B parallel to the longitudinal axis of the tubular anode 92. The vacuum pump, which is not shown, is connected to the pumping opening 102 of the vacuum vessel 80.

In this embodiment cosputtering is achieved using target plasma alignment. The high ionization of sputtered particles that occurs by virtue of the fact that the target 94, 94', 94" faces and is normal to the plasma beam is especially useful for coating wire or other linear-type substrates which are wrapped or fed around the cage-like frame 81. Small substrate parts, such as gears, etc., may be suspended from the cage-like frame 81 and be rotated during the coating process similar to parts hung from the chairs of a moving ferris wheel.

No gradients of sputter materials have been observed although different target materials are used together. For example, if copper and aluminum are selected targets, an unexpectedly discovered uniform coating on a wire or similar substrate has been obtained when using metal targets, a high ionization of the sputtered particles leading to better adhesion and coating is achieved. Additionally, a coating which is a different structure as compared to a metal sputtered by conventional means without ionization of the sputtered particles before reaching the substrate is obtained.

The preferred embodiment described above achieves the objects of the invention; however, it will be appreciated that variations and modifications can be made by those skilled in the art Without departing from the spirit and scope of the invention which is defined only by the following claims.

We claim:

1. Sputter coating apparatus comprising:

(a) vacuum chamber means connected to means for generating a plasma beam;
(b) target means in the vacuum chamber including magnetic means to direct the plasma beam to the surface of the target means, and means to accelerate ions in the plasma beam striking the surface of the target means to form sputtered particles;
(c) substrate holder means positioned in the chamber means for presenting a substrate to be coated with sputtered particles; and
(d) means for diverting a portion of the plasma beam to the substrate.

2. Apparatus of claim 1 wherein said plasma beam generator means comprises:
(a) electron emitter means;
(b) tubular anode means downstream of the emitter means having gas inlet means for admitting a process gas to ignite the plasma beam;
(c) process chamber means communicating with the anode means and said vacuum chamber means; and
(d) magnetic means for shaping and guiding the plasma beam through the anode means and the process chamber means.

3. Apparatus of claim 2 wherein the shape of the electron emitter means corresponds to the cross-sectional configuration of the plasma beam.

4. Apparatus of claim 3 wherein the electron emitter means is circular.

5. Apparatus of claim 3 wherein the electron emitter is rectangular.

6. Apparatus of claim 2 wherein the process chamber means is approximately polygonal in cross-section.

7. Apparatus of claim 2 wherein the process chamber means is approximately rectangular in cross-section.

8. Apparatus of claim 2 wherein the process chamber means is approximately oval in cross-section.

9. Apparatus of claim 2 wherein the process chamber means is approximately circular in cross-section.

10. Apparatus of claim 2 wherein the anode means and the process chamber means include at least two throat portions defining a chamber, said chamber communicating with vacuum means.

11. Apparatus of claim 2 wherein the electron emitter means is made of lanthanum hexaboride.

12. Apparatus of claim 1 wherein the target means is out of the path of the plasma beam.

13. Apparatus of claim 12 wherein the target means symmetrically surrounds the plasma beam and faces the substrate to be coated.

14. Apparatus of claim 13 wherein the target means is approximately trough-like in shape.

15. Apparatus of claim 13 wherein the target means is approximately dish-like in shape.

16. Apparatus of claim 13 wherein the target means is approximately funnel-like in shape.

17. Apparatus of claim 13 wherein the target means includes magnetic means for producing closed-loop magnetic tunnels on the surface of the target means.

18. Apparatus of claim 13 wherein the target means comprises a pair of targets.

19. Apparatus of claim 18 wherein the targets are rectangular in shape and each of the targets is positioned at an angle not greater than 90° to the axis of the plasma beam.

20. Apparatus of claim 1 including means to introduce a reactive substance to the area of the surface of the target means.

21. Apparatus of claim 20 wherein the means to introduce comprises gas inlet means and the reactive substance is a gas.

22. Apparatus of claim 21 wherein the gas inlet means is concentric with the target means.

23. Apparatus of claim 21 wherein the gas inlet means is approximately parallel to the surface of the target means.

24. Apparatus of claim 1 wherein the means for diverting a portion of the plasma beam includes magnet means associated with the substrate holder means.

25. Apparatus of claim 1 wherein the magnet means to direct the plasma beam is behind the surface of the target means.

26. Apparatus of claim 1 wherein the target means is adjustably positioned relative to the plasma beam.

27. Apparatus of claim 1 including means to cool the target means.

28. Apparatus of claim 1 wherein the target means comprises individual parts of at least two different materials.

29. Apparatus of claim 28 wherein the parts of the target means are concentrically arranged around the axis of the plasma beam, each part having independent means to accelerate ions in the plasma beam.

30. Apparatus of claim 29 wherein the parts of the target are side-by-side segments lying in a common plane, each part having independent means to accelerate ions in the plasma beam.

31. Apparatus of claim 1 wherein the means to accelerate ions is a high frequency voltage, voltage pulses or an adjustable alternating voltage.

32. Apparatus of claim 1 including means for applying an adjustable electrical voltage to the substrate to be coated.

33. Sputter coating method which comprises:
(a) providing a vacuum chamber and a plasma beam generator which communicates with the interior of the vacuum chamber;
(b) providing target means and substrate holder means in the vacuum chamber, said holder means presenting a substrate to be coated with sputtered particles;
(c) magnetically directing the plasma beam to the surface of the target means;
(d) accelerating ions in the plasma beam striking the surface of the target means to form sputtered particles; and
(e) diverting a portion of the plasma beam to the substrate.

34. Method of claim 33 wherein the target means is out of the path of the plasma beam.

35. Method of claim 33 wherein the target means symmetrically surrounds the plasma beam and faces the substrate to be coated.

36. Method of claim 33 wherein the target means faces and is normal to the plasma beam, the substrate holder is a cage-like holder in front of the target means which surrounds the plasma beam and step (e) is optional.

37. Method of claim 33 wherein the target means is divided into parts of different materials to be sputtered.

38. Method of claim, 37 wherein the parts of the target are concentric.

39. Method of claim 37 wherein the parts are side-by-side segments lying on the same plane.

40. Method of claim 33 which includes the step of introducing a reactive substance to the area of the target means.

41. Method of claim 40 wherein the reactive substance is a gas.

42. Method of claim 41 wherein the gas is introduced concentrically to the target.

43. Method of claim 33 wherein the plasma beam ionizes sputtered particles before their being coated on the substrate.

44. Method of claim 43 wherein the target is a metal and metal ions are sputter coated on the substrate.

45. Method of claim 33 wherein the target is a vaporizable material which is vaporized by the plasma beam and deposited on the substrate.

46. Method of claim 45 wherein the plasma beam ionizes vaporized material before the material is deposited on the substrate.

* * * * *